United States Patent
Juge (10) Patent No.: US 9,906,002 B2
(45) Date of Patent: Feb. 27, 2018

(54) RESISTIVE ELEMENT, RC MODULE, AND RC VOLTAGE DIVIDER FOR A HIGH-VOLTAGE ELECTRICAL SUBSTATION INSULATED BY A DIELECTRIC FLUID

(71) Applicant: Alstom Technology Ltd, Baden (CH)

(72) Inventor: Patrice Juge, Marcellaz Albanais (FR)

(73) Assignee: ALSTOM TECHNOLOGY LTD, Baden (CH)

( * ) Notice: Subject to any disclaimer, the term of this patent is extended or adjusted under 35 U.S.C. 154(b) by 0 days.

(21) Appl. No.: 14/774,169

(22) PCT Filed: Mar. 10, 2014

(86) PCT No.: PCT/EP2014/054540
§ 371 (c)(1),
(2) Date: Sep. 10, 2015

(87) PCT Pub. No.: WO2014/139924
PCT Pub. Date: Sep. 18, 2014

(65) Prior Publication Data
US 2016/0020586 A1    Jan. 21, 2016

(30) Foreign Application Priority Data

Mar. 12, 2013    (FR) ..................... 13 52183

(51) Int. Cl.
*H02B 7/01* (2006.01)
*G01R 15/06* (2006.01)
(Continued)

(52) U.S. Cl.
CPC .............. *H02B 7/01* (2013.01); *G01R 15/06* (2013.01); *H01C 1/16* (2013.01); *H01G 4/02* (2013.01);
(Continued)

(58) Field of Classification Search
CPC . H02B 7/01; G01R 15/06; H01G 4/02; H05K 2201/10022
See application file for complete search history.

(56) References Cited

U.S. PATENT DOCUMENTS 2,962,685 A * 11/1960 Langford ................. H01C 1/02
338/260
4,034,283 A * 7/1977 Pellegrino .............. H05G 1/265
323/370

(Continued)

FOREIGN PATENT DOCUMENTS

EP    0 980 003 A1    2/2000
FR    2 462 713 A1    2/1981

(Continued)

OTHER PUBLICATIONS

Search Report issued in French Patent Application No. FR 13 52183 dated Jan. 21, 2014.

(Continued)

*Primary Examiner* — Robert J Hoffberg
(74) *Attorney, Agent, or Firm* — Pearne & Gordon LLP (57) ABSTRACT

The invention provides a RC module (20) for a RC voltage divider for an electrical substation insulated by a dielectric fluid. The RC module (20) comprises first and second plane conductive supports (210a,b) separated from each other in order to co-operate with the dielectric fluid to form a capacitor, when the module equips an electrical substation. The module further comprises at least one resistive element (220a,b) electrically connecting together the first and the second conductive supports (210a,b), the resistive element comprising a printed circuit (222) defining a resistive electric circuit including a plurality of resistive 2-terminal components mounted in series. The invention also provides a resistive element and a voltage divider.

18 Claims, 6 Drawing Sheets

(51) Int. Cl.
    *H01C 1/16*      (2006.01)
    *H01G 4/02*      (2006.01)
    *H05K 1/02*      (2006.01)
    *H02B 1/015*     (2006.01)
    *H05K 1/18*      (2006.01)
(52) U.S. Cl.
    CPC ........... *H02B 1/015* (2013.01); *H05K 1/0296*
         (2013.01); *H05K 1/181* (2013.01); *H05K*
                                   *2201/10022* (2013.01)

(56) References Cited

U.S. PATENT DOCUMENTS

| | | | | |
|---|---|---|---|---|
| 4,675,720 | A * | 6/1987 | Ikegame | G02B 6/4295 165/80.1 |
| 7,123,032 | B2 * | 10/2006 | Yakymyshyn | G01R 15/06 324/705 |
| 7,129,693 | B2 * | 10/2006 | Yakymyshyn | G01R 15/06 324/126 |
| 8,963,533 | B2 * | 2/2015 | Garabieta Artiagoitia | H01C 1/16 323/369 |
| 9,766,272 | B2 * | 9/2017 | Chatrefou | G01R 15/06 |
| 2006/0012382 | A1 | 1/2006 | Yakymyshyn | |
| 2013/0191050 | A1 | 7/2013 | Juge | |
| 2017/0285073 | A1 * | 10/2017 | Fluri | G01R 15/06 |

FOREIGN PATENT DOCUMENTS

JP     55075654 A  *  6/1980
WO   2006/105966 A     2/2006

OTHER PUBLICATIONS

International Search Report issued in Application No. PCT/EP2014/054540 dated Jun. 5, 2014.
Written Opinion issued in Application No. PCT/EP2014/054540 dated Jun. 5, 2014.

* cited by examiner

RESISTIVE ELEMENT, RC MODULE, AND RC VOLTAGE DIVIDER FOR A HIGH-VOLTAGE ELECTRICAL SUBSTATION INSULATED BY A DIELECTRIC FLUID

TECHNICAL FIELD

The invention relates to the field of measuring voltage and to the field of devices making such voltage measurement possible.

Measuring voltage in high-voltage electrical substations insulated by a dielectric fluid necessarily requires voltage measurement devices that are adapted to withstand high voltage.

Among such devices, voltage dividers are particularly suitable because of the possibility of voltage reduction that they offer. When such voltage dividers are resistive-capacitive (RC) voltage dividers, they are generally made up of resistive and capacitive elements that are connected together in series.

The invention relates more precisely to a resistive element, to a RC module, and to a RC voltage divider.

STATE OF THE PRIOR ART

Regardless of whether they are purely resistive or of the RC type, i.e. of the resistive-capacitive type, voltage dividers designed to equip high-voltage electrical substations are based on using at least one resistive or RC module disposed between a phase of the electrical substation and ground thereof.

More precisely, for RC voltage dividers, the modules, which are thus of the RC type, generally include at least one ceramic support disposed between two plates in order to form a capacitor, the ceramic support acting as the insulator.

As described in Documents FR 2 462 713 and EP 0980 003, each RC module includes a ceramic support on which at least one resistive circuit is written that interconnects the two plates of the capacitor that sandwich the ceramic support. Each module thus forms an RC circuit in which the capacitor, formed by the two plates, and the resistor, formed by the at least one resistive circuit, are connected together in parallel.

In order to form a voltage divider, these modules are connected together in series between one of the phases, namely the high voltage, and ground, namely the low voltage, of the electrical substation.

Although such modules make it possible to form a voltage divider that is particularly suitable for measuring high voltages, they suffer from certain drawbacks. The technologies making it possible to write a resistive circuit onto a ceramic are particularly costly because they are difficult to control. In addition, because ceramic is used as the support, such modules are heavy and brittle. As a result, high constraints need to be complied with when transporting such modules, and they have low strength in terms of ability to withstand shocks, such as the shocks that can be suffered during an earthquake.

SUMMARY OF THE INVENTION

An object of the invention is to solve those drawbacks.
Thus, an object of the invention is to provide RC modules for RC voltage dividers that are of reduced weight compared with prior art RC modules.

Another object of the invention is to provide RC modules for RC voltage dividers that have low sensitivity to shocks.

To this end, the invention relates to a RC module for a RC voltage divider for an electrical substation insulated by a dielectric fluid, the RC module comprising first and second plane conductive supports separated from each other in order to co-operate with the dielectric fluid to form a capacitor, when the module equips an electrical substation, and the module further comprising at least one resistive element electrically connecting together the first and the second conductive supports, the resistive element comprising a printed circuit defining a resistive electric circuit including a plurality of resistive 2-terminal components mounted in series.

Above, and in the remainder of this document below, the term "printed circuit" means a support adapted to support and to connect together discrete electronic components, such as resistive 2-terminal components, and thus to define an electric circuit, when it is equipped with said components A RC module including such a resistive element placed between two mutually facing conductive plates makes it possible to use the dielectric fluid of the electrical substation that it equips as an insulator of the capacitor and therefore does not need any supporting ceramic. Thus, such a RC module does not suffer from the drawbacks of a prior art RC module that uses a ceramic support.

Such a RC module is thus particularly light in weight and has good strength in terms of ability to withstand shocks compared with a prior art RC module.

It can also be noted that, with such a resistive element, the resistive element can have high resistance, despite the use of resistive 2-terminal components having resistance lower by more than one order of magnitude than the resistance of the resistive element. This possibility of high resistance is coupled with power dissipated by a resistive 2-terminal component that is low, since the power dissipated per resistive element is distributed between the resistive 2-terminal components.

The module may comprise four resistive elements mounted in parallel between the first and the second conductive supports.

Such redundancy of the resistive elements makes it possible to divide by four the power to be dissipated by each of the resistive elements unlike with a RC module that has only one resistive element. In addition, such a RC module is particularly reliable, since it can continue to operate even if two of the four resistive elements fail.

The first and second conductive supports may be circularly symmetrical about an axis of revolution, the four resistive elements being distributed between the first and the second conductive supports with axial symmetry.

Such a configuration of the resistive elements makes it possible to reduce the problems of non-uniformity and of asymmetry in electric field that might result from an inappropriate arrangement of the resistive elements.

The resistive elements may be crisscrossed.

The resistive elements may be arranged on the module in such a manner that they form an angle of 45° with the plane of the first conductive support.

A module in which the resistive elements are mounted in such a configuration is particularly adapted for being disposed in the voltage divider at the high voltage and is particularly compact.

The resistive elements may be substantially perpendicular to the first and to the second conductive supports.

This configuration is particularly suitable for forming a RC module dedicated to measuring voltage.

The invention also provides a resistive element for a RC module of the invention, said element comprising a printed circuit defining a resistive electric circuit including a plurality of resistive 2-terminal components mounted in series.

Such an element is particularly suitable for forming a lightweight RC module with low sensitivity to shocks. Since the resistive element comprises a printed circuit, it makes it possible to avoid the necessity of a ceramic support that is necessary in prior art RC modules.

The plurality of resistive 2-terminal components may include a majority of discrete components and preferably comprises discrete components only.

The printed circuit may include a dielectric support on which a plurality of conductive track portions are disposed that are connected together in such a manner as to form the resistive electric circuit, at least two conductive track portions being separated from each other by an opening provided in the support.

Such an opening is particularly advantageous for the dielectric strength between the two conductive track portions separated by said opening. The dielectric strength of dielectric fluids, such as sulfur hexafluoride in its gaseous form, present in electric substations insulated by a dielectric fluid, is generally significantly greater than the dielectric strength of the dielectric supports of printed circuits (e.g. epoxy has dielectric strength 9 times less than the dielectric strength of sulfur hexafluoride in its gaseous form). Thus, it is possible to reduce the distance between the two track portions that are separated by the opening and thus to procure a restive element that is compact.

The printed circuit may include a dielectric support on which a plurality of conductive track portions are disposed that are mutually parallel and that are connected together in such a manner as to form the resistive electric circuit, two consecutive conductive track portions being separated from each other by an opening provided in the support.

The printed circuit may have first and second faces, the resistive electric circuit going by turn from the first face to the second face in such a manner that the resistive 2-terminal components are distributed over each of the faces of the printed circuit.

Such a configuration of the module is particularly advantageous for the dielectric strength of such a resistive element, and for its heat dissipation. With the resistive 2-terminal components being distributed over each of the faces of the printed circuit, it is possible to adapt the electric circuit in such a manner as to almost double the distance between the components and thus between the tracks of the electric circuit. Thus, the risks of arcing between two consecutive conductive tracks are reduced. In addition, this distance between the resistive 2-terminal components makes it possible to reduce the confinement of the heat emitted by said resistive 2-terminal components because of the Joule effect.

The resistive circuit on each of the first and second faces may be essentially formed by mutually parallel conductive track portions along which the resistive 2-terminal components are distributed and that are electrically connected together by conductive track portions present on the other face of said printed circuit.

The above phrase "the electric circuit is essentially formed by mutually parallel conductive track portions" means that the mutually parallel conductive track portions represent over 50% of the linear distance of the circuit, and preferably 70% of said linear distance, or indeed 90% thereof. Naturally, the "linear distance" means the length of the track, the 2-terminal components in themselves not being to be taken into account in calculating the linear distance of the circuit.

The spacing between said conductive track portions may be adapted to limit the risks of electrical interaction between them.

The printed circuit may have a dielectric support adapted to electrically insulate a conductive track portion on the first face from a conductive track portion on the second face.

Such a dielectric support offers good dielectric insulation between the conductive track portions that are present on one face, and the conductive track portions that are present on the other face.

The dielectric support may be a glass/polyepoxide support such as, for example an FR4 support, i.e. graded as Flame Resistant 4.

The thickness of the support may be greater than or equal to 3.2 millimeters (mm).

The dielectric support may be made of a dielectric polymer in such a manner as to allow the support to flex and thus to allow the resistive element to flex.

The resistive 2-terminal components may be chosen from among resistors of the surface-mount component type, resistors of the through-hole component type, and tracks made of resistive material, such as carbon black, deposited on the surface of the printed circuit.

The invention also provides a RC module for a RC voltage divider for an electrical substation insulated by a dielectric fluid, the RC module including at least one resistive element of the invention in parallel with a capacitive element.

Such a module offers the advantage of using the dielectric fluid of the electrical substation that it equips as an insulator and therefore does not have any supporting ceramic. Thus, such a RC module does not suffer from the drawbacks of a prior art RC module that uses a ceramic support.

Such a RC module is particularly light in weight and has good strength in terms of ability to withstand shocks compared with a prior art RC module.

The capacitive element may comprise first and second plane conductive supports separated from each other in order to co-operate with the dielectric fluid to form a capacitor, when the module equips an electrical substation, the resistive element electrically connecting together the first and the second conductive supports.

The invention also provides a set of RC modules including a plurality of resistive elements of the invention, two successive resistive elements being electrically connected together by a plane conductive support, the links between each of the resistive elements and the plane conductive supports to which it is connected being foldable in such a manner as to allow two consecutive conductive supports to be placed facing each other while also being mutually parallel so as to co-operate with the resistive element connecting them together to form a RC module of the invention.

Such a set of RC modules makes it possible to form a voltage divider that is particularly robust in withstanding shocks, the foldable links making it possible to absorb a fraction of the potential energy transmitted by such shocks.

Each resistive element may be flexible in such a manner as to allow folding of the link between a resistive element and one of the conductive supports to which it is connected.

Flexing of the resistive elements makes it possible to absorb the movements transmitted to the voltage divider either during a shock, or because of the thermal expansion of certain elements of the voltage divider and/or of the chamber containing the voltage divider.

The invention further provides a voltage divider designed to equip a high-voltage substation insulated by a dielectric fluid, the voltage divider comprising at least two RC modules of the invention connected together in series between ground of the substation and a phase of the same substation.

Such a voltage divider is particularly light in weight and insensitive to shocks compared with a prior art voltage divider.

The invention further provides a voltage divider designed to equip a high-voltage substation insulated by a dielectric fluid, the voltage divider comprising at least one set of modules of the invention, the resistive elements and the conductive supports being folded in such a manner that two consecutive conductive supports are facing each other while also being mutually parallel.

Such a voltage divider is particularly insensitive to shocks compared with a prior art voltage divider.

The dielectric fluid may be a dielectric gas.

The dielectric fluid may be sulfur hexafluoride ($SF_6$).

BRIEF DESCRIPTION OF THE DRAWINGS

The present invention can be better understood on reading the following description of embodiments, given merely by way of non-limiting indication and with reference to the accompanying drawings, in which.

Identical, similar, or equivalent portions of the various figures bear like references in such a manner as to facilitate going from one figure to another.

The various portions shown in the figures are not necessarily shown at a uniform scale, in order to make the figures clearer.

The various possibilities (variants and embodiments) should be understood as not being mutually exclusive and may be combined with one another.

DETAILED DESCRIPTION OF PARTICULAR EMBODIMENTS

Figure 1:
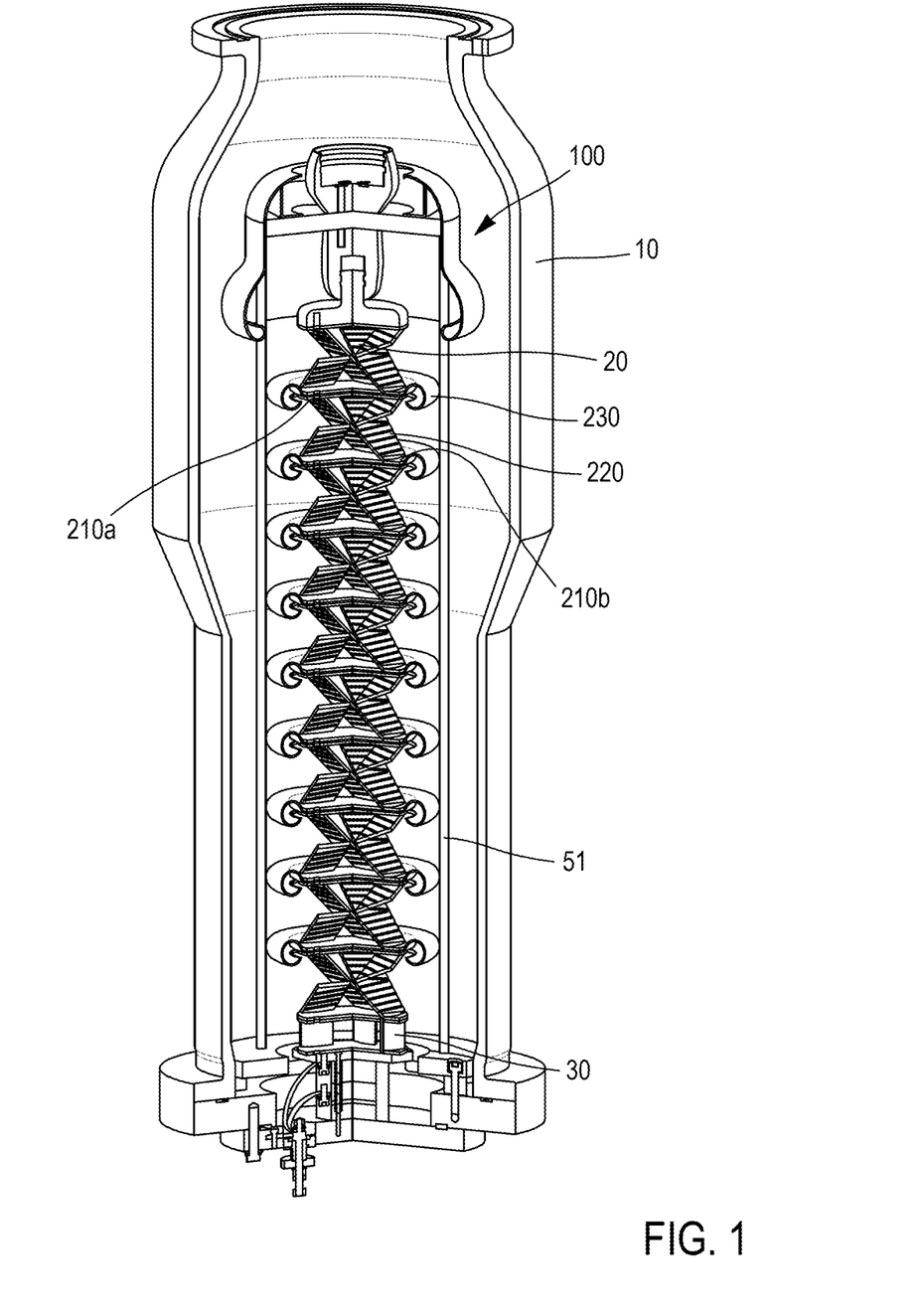
FIG. 1 is a view in three dimensions of a chamber designed to equip a gas-insulated electrical substation, said chamber including a voltage divider of the invention.

FIG. 1 shows a chamber 10 of a high-voltage electrical substation insulated by a dielectric fluid, such as SF6 gas, in which chamber a first embodiment of a RC voltage divider 100 of the invention is installed.

A RC voltage divider 100 of the invention includes a plurality of modules RC 20, 30 connected together in series between a phase of the high-voltage substation and low voltage, i.e. ground of the same substation.

The RC voltage divider 100 shown in FIG. 1 thus has ten ordinary RC modules 20 and one measurement RC module 30. The ordinary RC modules 20 and the measurement RC module 30 can be held together by means of screws made of an insulating material and by means of a system of side uprights 51.

Figure 2:
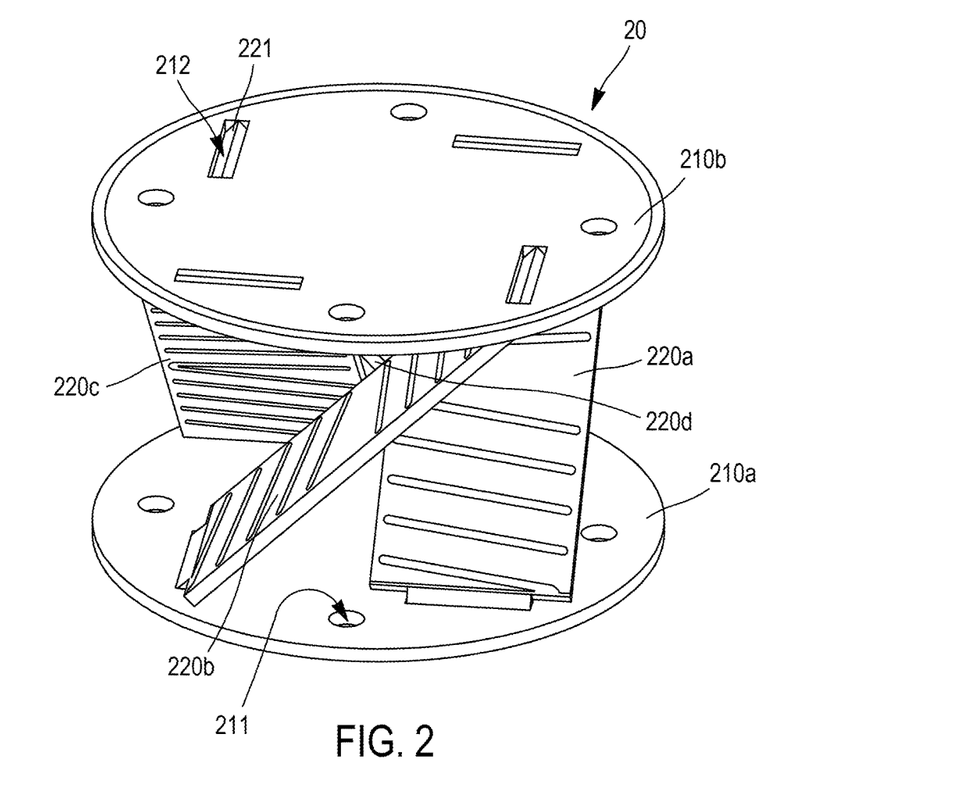
FIG. 2 shows a RC module including four resistive elements, said RC module equipping a voltage divider as shown in FIG. 1.

As shown in FIG. 2, each RC module 20, 30, be it an ordinary module or a measurement module, is made up of first and second plane conductive supports 210a,b and of four resistive elements 220a,b,c,d.

The conductive supports 210a,b, of the same RC module 20, 30 are two supports made of a conductive material and arranged in the RC module 20, 30 in such a manner as to form a plane capacitor, the dielectric fluid of the high-voltage substation that is present between the conductive supports 210a,b forming the insulator of the capacitor.

Each of the conductive supports 210a,b may, as is shown in FIG. 2, be in the form of a disk, and the conductive supports 210a,b are thus circularly symmetrical about an axis of revolution. The material of each of the conductive supports 210a,b may be a metal such as steel or aluminum. The two conductive supports 210a,b of the same RC module 20, 30 are arranged in said same RC module to be parallel and facing each other.

As shown in FIG. 2, the conductive supports 210a,b may also be provided with openings 211 in order to limit the risks of the fluid stagnating between the two conductive supports 210a,b and thus in order to facilitate thermal convection.

Each of the conductive supports 210a,b has four connection systems, each for connecting a corresponding one of the resistive elements of the RC modules 20, 30. In the embodiment shown in FIG. 2, such a connection system takes the form of a slot 212 provided in each conductive support 210a,b for receiving one end 221 of one of the resistive elements 220a,b,c,d of the corresponding RC module 20, 30.

In order to obtain a uniform distribution of the electric field in the vicinity of the RC modules 20, 30, one of the conductive supports 210a,b of each RC module may be equipped with an anti-corona ring that, in the embodiment shown in FIG. 1, is in the form of metal torus-shaped tube 230 that comes to be placed at the periphery of each conductive support 210a,b. Thus, the conductive supports 210a,b do not have any sharp edges that might disturb the electric field and facilitate partial discharge phenomena.

Figure 3:
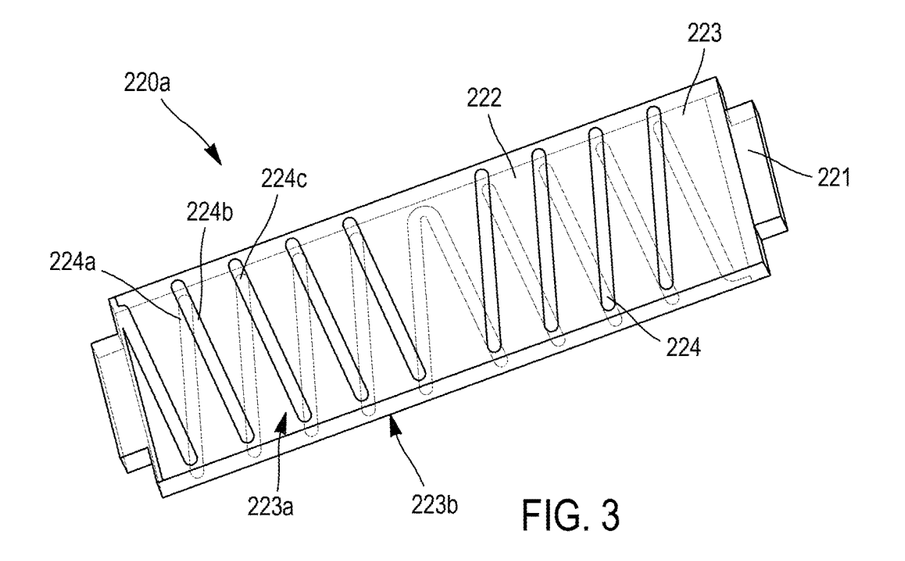
FIG. 3 is an outline view of a resistive element equipping a RC module as shown in FIG. 2.
Figure 4A:
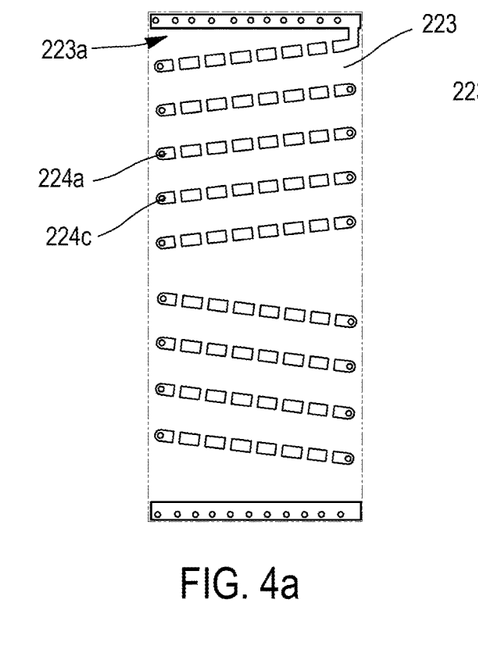
FIGS. 4a and 4b show the electric circuits of the first and second faces of the resistive element shown in FIG. 3.
Figure 4B:
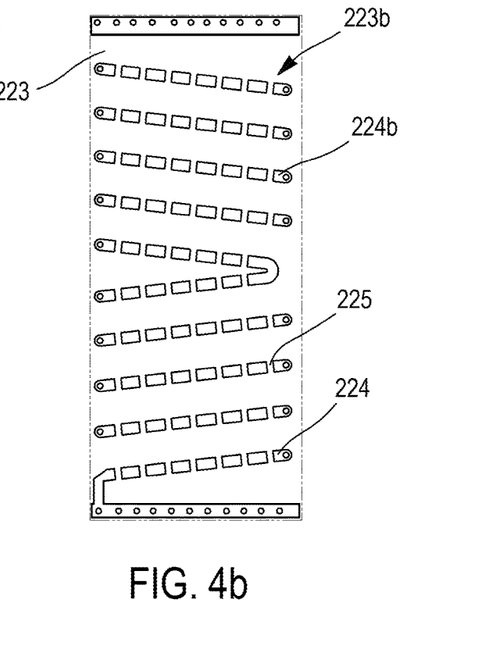

As shown in FIGS. 3, 4a, and 4b, each resistive element 220a,b,c,d, has a printed circuit 222 defining an electric circuit including a plurality of resistive 2-terminal components that are not shown.

In this first embodiment, each of the printed circuits 222 comprises a plane dielectric support 223 including a conductive track 224 that, together with the plurality of resistive 2-terminal components, form the electric circuit. Each dielectric support 223 has first and second faces 223a,b. In a possibility of the invention, the dielectric supports 223 may be supports made of a polyepoxide, a composite including a polyepoxide or any other electrically insulating substrate.

In the same possibility, the dielectric supports 223 may be made of a glass fiber/polyepoxide composite of the FR4 type that is better known as FR4 epoxy glass fabric.

In the embodiment shown in FIG. 3, each dielectric support 223 is in the general shape of a plane longitudinal rectangular block. At its ends 223, each of the dielectric supports is provided with a protrusion adapted to co-operate with a connection system of one of the conductive supports 210a,b of the corresponding RC module 20, 30. The thickness of the dielectric support 223 is adapted to limit the risks of puncturing the insulator between two conductive tracks that are situated respectively on the first face 223a and on the second face 223b of the dielectric support 223 to which a voltage is applied that is of amplitude similar to the amplitude of the voltage that is applied to the resistive element in operation of the RC voltage divider 100. Thus, when the dielectric support 223 is a support of the FR4 type, the thickness of the dielectric support 223 may be greater than 3.2 mm in the usual configuration of the invention.

In an advantageous configuration of the invention shown in FIG. 3, the conductive tracks 224 go by turn alternation from the first face 223a of the corresponding dielectric support 223 to the second face 223b of the same dielectric support 223. In the configuration shown in FIG. 3, such going by turn from the first face 223a of the dielectric support 223 to the second face 223b thereof is obtained by through connections provided in the corresponding dielectric support 223. Such a configuration is particularly advantageous for dissipating heat from the resistive 2-terminal components, which are distributed over the two faces of the dielectric support 223.

The conductive tracks 224 interconnect the resistive 2-terminal components and enable the resistive 2-terminal components to be fastened mechanically by soldering. In a usual configuration of the printed circuits, the conductive tracks 224 may be made of copper. In this configuration, in order to avoid reduction-oxidation interactions between the conductive supports 210a,b and the conductive tracks 224, the copper may be provided with a tin or nickel/gold finish. By way of an alternative to copper conductive tracks, the conductive tracks 224 may be made of a metal other than copper, such as aluminum, or any other material that conducts electricity at least partially.

Each conductive track 224 is made up of a plurality of track portions 224a,b,c extending over one face 223a,b of the corresponding dielectric support, by turn over its first face 223a and over its second face 223b. Two consecutive track portions 224a,b are interconnected via one of the through connections. The track portions 224a,b,c of the same conductive track 224 are connected together in this way in such a manner that said track portions are connected together in series between the two ends of the dielectric support 223.

The track portions 224a,c that are consecutive on the same face 223a,b of a dielectric support 223, in order to limit the risks of electrical interactions, such as arcing, between said track portions, are generally substantially mutually parallel. This feature is also advantageous for dissipating the heat energy emitted by the resistive 2-terminal components equipping the electric circuit. In the configuration shown in FIGS. 3, 4a, and 4b, in order to ensure that the path of each of the conductive tracks 224 is symmetrical, the track portions 224a,b,c at the two ends 221 of each of the dielectric supports 223 and the track portions that are situated at the center of the same dielectric support 223 do not satisfy that characteristic.

In the configuration shown in FIGS. 3, 4a, and 4b, the path of each of the conductive tracks 224 is substantially sawtooth-shaped. As an alternative to such a path, in configurations that are not shown, the path of each of the conductive tracks 224 may be of different shape, such as a sinusoidal shape, or a crenellated shape, without going beyond the ambit of the invention.

Each of the track portions 224a,b,c is formed by a track segment having, as shown in FIGS. 4a and 4b, discontinuities 225, each adapted to receiving a resistive 2-terminal component. The resistive 2-terminal components equip these discontinuities 225 in such a manner that each resistive 2-terminal component connects together the two pieces of the corresponding track portion 224a,b,c that are separated by said discontinuity 225. In this manner, the resistive 2-terminal components are mounted along the corresponding conductive track 224 in series and while providing electrical continuity for said conductive track.

In the embodiment shown in FIG. 3, the resistive 2-terminal components are resistors of the surface-mount component type also referred to as the "SMC-type". In other possibilities that are alternatives to SMC-type resistors, the resistive 2-terminal components may be standard resistors having through pins or indeed a track formed of a resistive material such as carbon black. In a configuration that is usual but that is not necessarily a configuration of the invention, the resistive 2-terminal components equipping any given resistive element 220a,b,c,d have substantially identical resistance.

Thus, the conductive track 224 of each resistive element 220a,b,c,d defines a resistive electric circuit having a plurality of resistive 2-terminal components mounted in series. The resistance of any given resistive element 220a,b,c,d is thus equal to the sum of the resistances of the components mounted along its conductive track. In addition, the voltage applied between the ends of said resistive element is thus distributed between the various resistive 2-terminal components. Thus, by means of these two characteristics, the resistive elements 220a,b,c,d can have high resistance, despite the use of resistive 2-terminal components having resistance lower by more than one order of magnitude with power dissipated per resistive 2-terminal component that is low, the power dissipated per resistive element 220a,b,c,d being distributed over all of the resistive 2-terminal components.

Each conductive track 224, with the resistive 2-terminal components that are mounted therealong, forms a resistive electric circuit.

Figure 5:
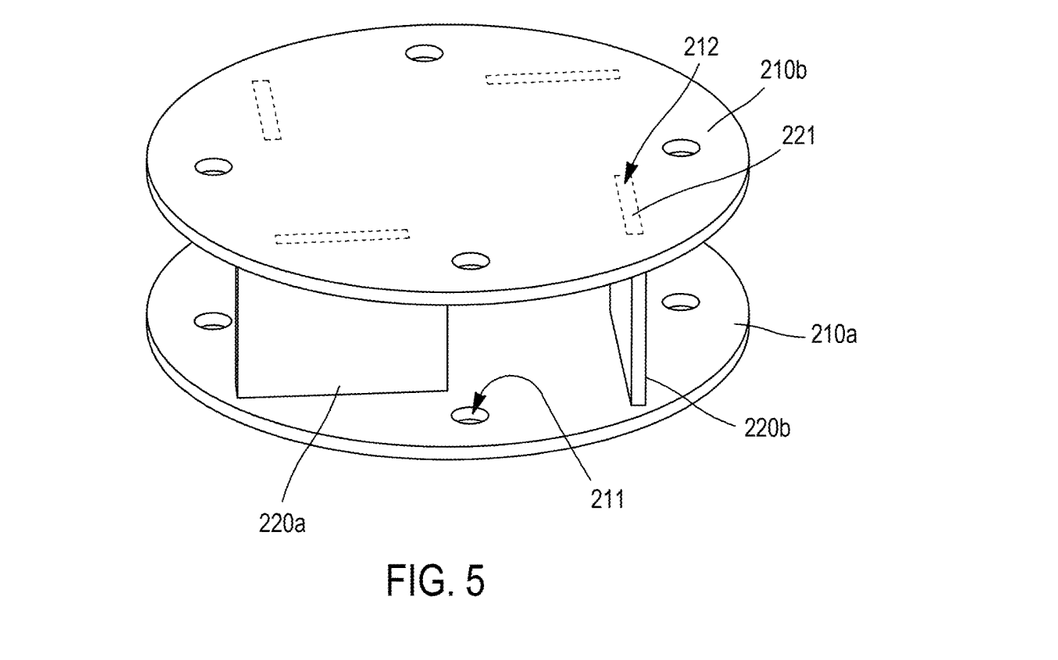
FIG. 5 shows a RC module including four resistive elements as shown in FIGS. 3, 4a, and 4b, said module equipping a voltage divider as shown in FIG. 1 at its portion that is in contact with the low voltage.

As shown in FIGS. 2 and 5, there are four resistive elements 220a,b,c,d in any one of the ordinary RC modules 20, as there are in the measurement RC module 30. The resistive elements 220a,b,c,d of any one RC module 20, 30 are mounted between two plane supports, their two ends 221 co-operating respectively with one of the respective connection systems of the first and of the second conductive supports 210a,b.

The resistive elements 220a,b,c,d are mounted in a RC module 20,30, the four resistive elements 220a,b,c,d being distributed between the first and the second conductive support 210a,b with axial symmetry. The resistive elements 220a,b,c,d in the same module RC are crisscrossed. The resistive elements are arranged on the RC module in such a manner that they form an angle of 45° with the plane of the first conductive support 210a.

In an embodiment of the invention, the resistive elements 220a,b,c,d may take the form of a support of the FR4 type having a length of 100 mm for a width of 40 mm and a thickness of 3.2 mm. The conductive track of such an element, by following a path as shown in FIGS. 4a and 4b, may have 140 resistive 2-terminal components. Each conductive support may have a diameter of 120 mm with a space between the two conductive supports of 80 mm.

With resistive 2-terminal components adapted to dissipate energy lying in the range 0.25 watts (W) to 1 W and to withstand voltage 1,000 volts (V), a RC module in this embodiment and when it equips a high-voltage electrical substation that is insulated with sulfur hexafluoride (SF6), has the following characteristics:

a nominal voltage applicable across the two conductive supports greater than 30,000 V;

voltage strength before breakdown greater than 100,000 V;

dissipation of nearly 30 W for current of 1 milliamps (mA), i.e. 8 W per resistive element with each of the resistive 2-terminal components that, in operation, dissipates 0.06 W.

In addition, in this embodiment, when two of the resistive elements 220a,b,c,d are damaged by being equivalent to an open circuit, the power dissipated by each of the resistive 2-terminal components of the resistive elements 220a,b,c,d that are not damaged remains confined to 0.12 W without significant impact on operation of the RC voltage divider 100.

It can thus be seen that a single RC module 20, 30 can withstand applied voltage values of the same order of magnitude as the voltage existing between a phase and ground at the high-voltage electrical substation, in spite of standard resistive 2-terminal components being used.

In the measurement RC module 30, shown in FIG. 5, the resistive elements 220a,b,c,d are mounted differently than in an ordinary RC module 20. The resistive elements 220a,b,c,d of the measurement RC module 30 are mounted in the measurement RC module 30 perpendicularly to the first and to the second support 210a,b. Each resistive element 220a,b,c,d of the measurement RC module 30 is mounted substantially parallel to the resistive element 220a,b,c,d that is axially opposite from it and substantially perpendicular to the other two resistive elements 220a,b,c,d.

Each of the resistive elements 220a,b,c,d of the measurement module 30 RC is adapted to enable voltage to be measured. Such an adaptation is obtained, for example, by the presence of electrical connections going towards the outside of the chamber 10 and that make it possible to measure the voltage across the terminals of one or more resistive 2-terminal components of the resistive element 220a,b,c,d. The same resistive elements 220a,b,c,d may also include sensors, such as temperature sensors or pressure sensors in order to determine the conditions that prevail in the chamber and in order to correct the measured value as a function of those conditions. Using the same principle, the measurement RC module 30 may also include a data storage system, such as an optionally re-writable non-volatile memory that is writable or otherwise and in which parameters are indicated that make it possible to calibrate the measurement as a function of the conditions prevailing in the chamber 10. Such a storage system may, for example, be present on each of the resistive elements 220a,b,c,d equipping the measurement RC module 30.

In the configuration shown in FIG. 1, the RC voltage divider of 100 of the invention is connected electrically to a phase of the high-voltage electrical substation via a sliding electrical connection system, in such a manner as to allow the connector to be moved depending on thermal expansion of the RC modules 20, 30.

Figure 6:
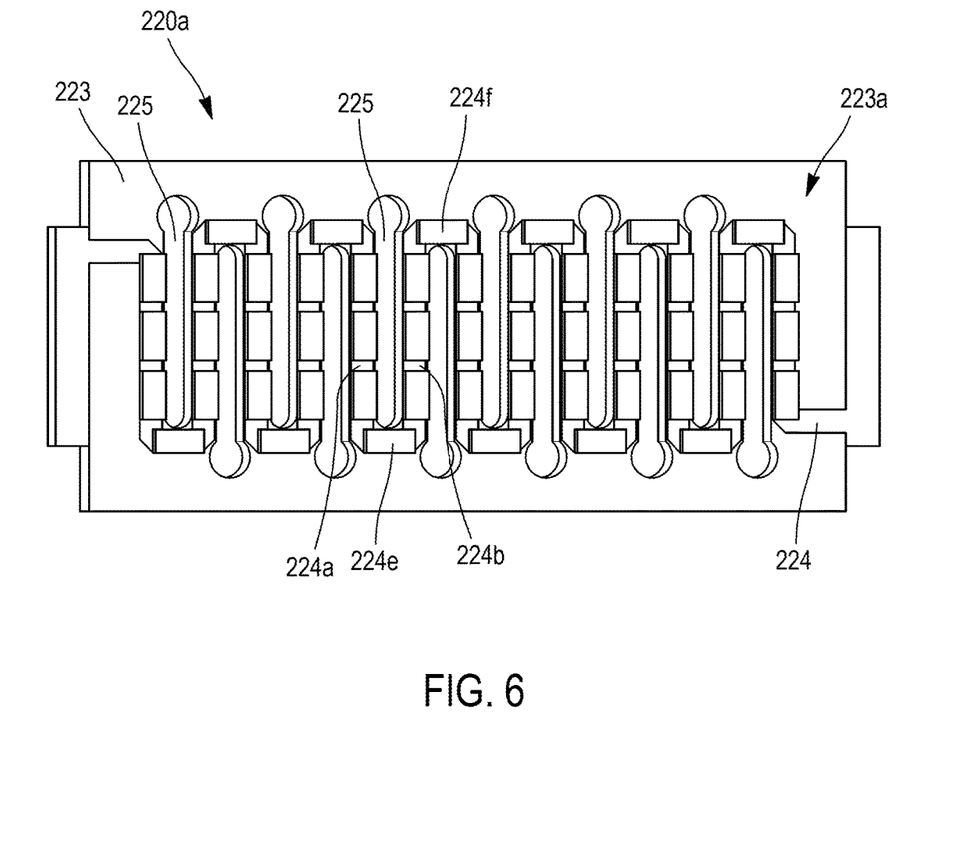
FIG. 6 shows a resistive element for a RC module of a second embodiment of a voltage divider of the invention, said resistive element having a support with openings in order to improve the insulation between the successive conductive track portions.

FIG. 6 shows a resistive element 220a equipping a second embodiment of a voltage divider 100 of the invention. This second embodiment of a voltage divider 100 differs from the first embodiment of a voltage divider 100 in that the RC modules 20, 30 that make up the voltage divider 100 include resistive elements 220a in which a fraction of their dielectric strength is provided by openings provided in the printed circuit.

In this second embodiment, the conductive track extends over the first face 223a of the dielectric support 223 only. The main track portions 224a,b are substantially mutually parallel and extend transversely relative to the length of the dielectric support 223. The main track portions 224a,b are connected together via secondary track portions 224e,f that are substantially parallel to the length of the dielectric support 223. Each of the main conductive tracks 224a,b is separated from the main track portion 224a,b that succeeds it directly along the conductive track 224 by an opening 225 provided in the dielectric support 223. The openings 225 in the dielectric support are openings passing through the dielectric support 223 over its entire thickness. Each of the openings 225 extends along track portions 224a,b that it separates.

Thus, with such openings 225, the resistive element 220a has improved dielectric strength. By means of the corresponding opening being provided, each separation between two consecutive track portions 224a,b comprises both the surface of the insulating support with the dielectric fluid and the fluid itself. This surface of the insulating support with the dielectric fluid is characterized by dielectric strength that is about three times higher than that of epoxy (commonly 3 kilovolts per millimeter (kV/mm)) and about three times lower than that of sulfur hexafluoride.

In this second embodiment, it can be noted that although the conductive track 224, and thus the resistive 2-terminal components, are distributed over a single face of the dielectric support, it is also possible, without going beyond the ambit of the invention, to distribute the conductive track over both faces of the dielectric support. In such a configuration, which is not shown, two main track portions 224a,b that succeed each other along the conductive track may be separated from each other by an opening provided in the dielectric support. Such a configuration is particularly advantageous for dielectric strength and makes it possible to achieve good dissipation of the heat emitted by the resistive 2-terminal components.

Figure 7:
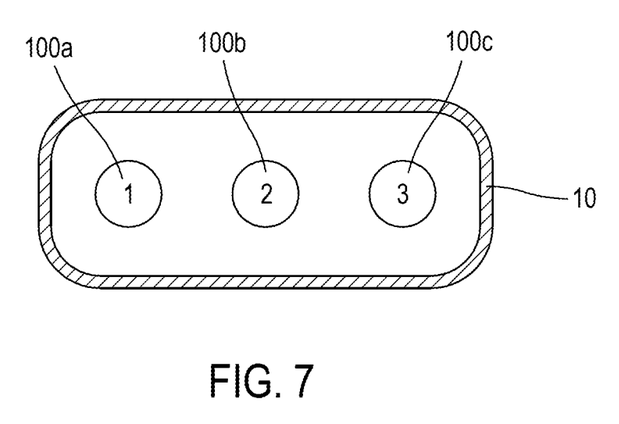
FIG. 7 shows a plurality of voltage dividers distributed in such a manner as to equip each of the phases of a gas-insulated electrical substation.

FIG. 7 shows an alternative for installing a RC voltage divider 100 of the invention in a three-phase high-voltage electrical substation. In this alternative installation configuration, the high-voltage electrical substation includes three RC voltage dividers 100a,b,c of the invention, which voltage dividers are installed, as shown by the section of chamber 10 shown in FIG. 8, in the same chamber 10 that, for this purpose, has an elongate section.

Figure 8:
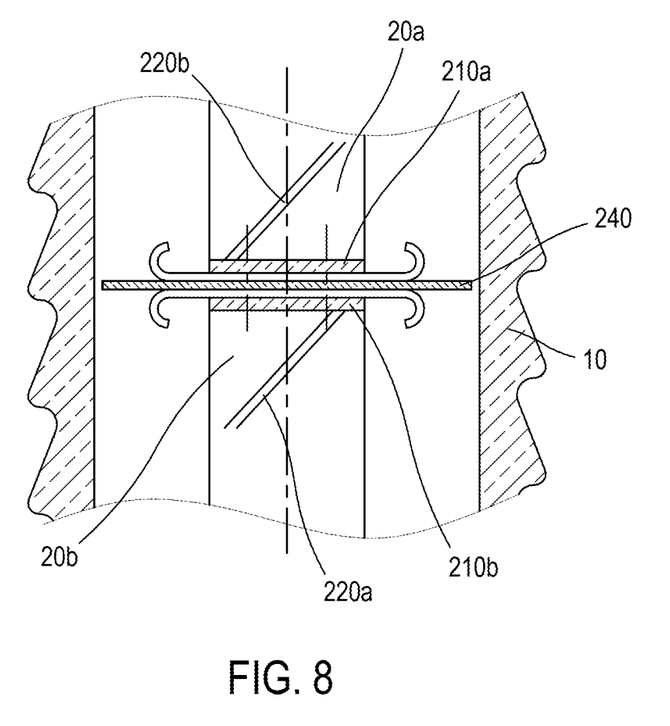
FIG. 8 shows a centering system of a divider as shown in FIG. 1.

FIG. 8 shows an alternative and advantageous possibility of the invention for which the anti-corona ring 230 is integrated into each conductive support 210a,b and for which two successive RC modules 20a,b in the RC voltage divider 100 are separated by an intermediate part 240 adapted to co-operate with the wall of the chamber 10 in which the RC voltage divider 100 is installed. Such an intermediate part 240 acts as a centering system for centering the RC voltage divider 100.

In this alternative possibility, in order to avoid disturbing the electric field in the chamber 10 that, in the particular example of FIG. 8, is made of an insulating material, the intermediate part 240 may be made of a dielectric material such as a polyepoxide or a composite including a polyepoxide.

Figure 9A:
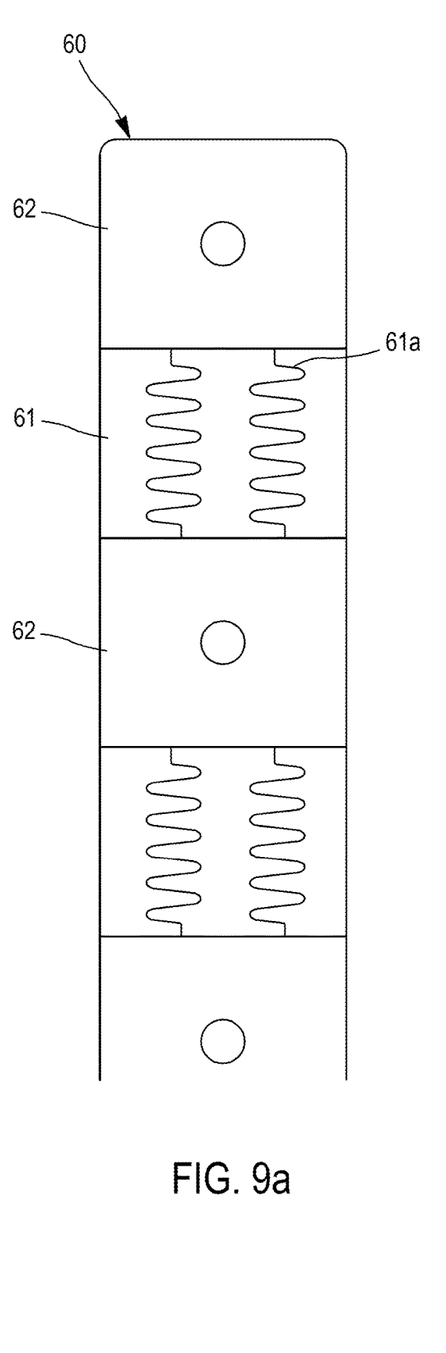
FIGS. 9a and 9b show a set of RC modules designed to form a second embodiment of a voltage divider.
Figure 9B:
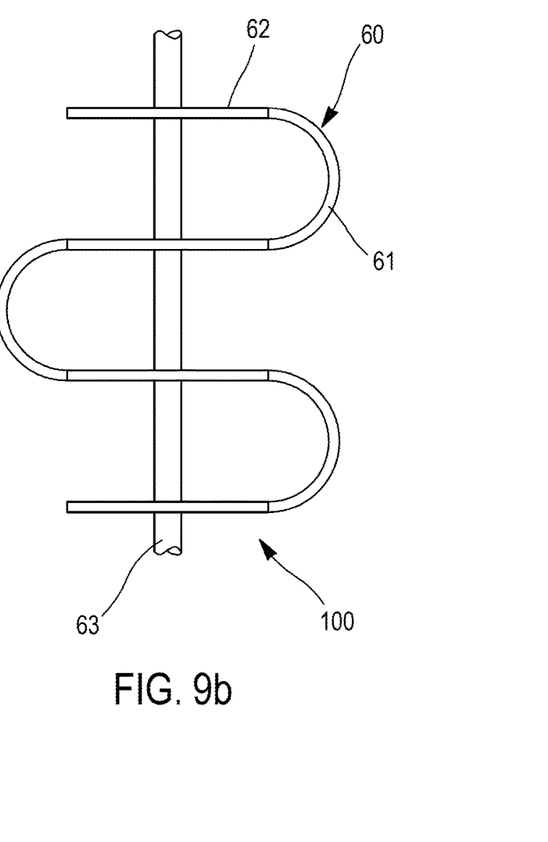

FIGS. 9a and 9b show a third embodiment of the invention in which the RC voltage divider 100 is formed by means of a set of RC modules 60. Such a RC voltage divider 100 differs from the first embodiment of a RC voltage divider in that it is formed by means of a set of modules 60 including resistive elements 61 and conductive supports 62, two successive resistive elements 61 being connected together by a conductive support 62, the link between each of the resistive elements 61 and the conductive supports 62 to which it is connected being foldable.

FIG. 9a shows the set of modules 60 in the unfolded position. In a manner identical to the conductive supports of the first embodiment, the conductive supports 62 are made of a conductive and rigid material like a metal such as aluminum or steel. In order to facilitate folding and forming the voltage divider, the conductive supports 62 are of square shape.

In the configuration shown in FIGS. 9a and 9b, each of the resistive elements 61 is formed by a flexible printed circuit. Such flexible printed circuits make it possible to provide a flexible link with the conductive supports 62 to which they are connected. Thus, such a flexible link is foldable. Each resistive element 61 has four conductive tracks 61a on which resistive 2-terminal components are mounted, using a principle similar to the one used for the resistive elements 220a,b,c,d of the first embodiment. Each of these conductive tracks 61a co-operates with the corresponding resistive 2-terminal components to form a resistive electric circuit.

FIG. 9b shows how the set of modules 60 are mounted when they form a voltage divider 100. In such a mounting configuration, the set of modules 60 are mounted in such a manner that two consecutive conductive supports 62 are facing each other while being mutually parallel. In the configuration shown in FIG. 9b, this mounting is obtained by means of an insulating pin 63 carrying the conductive supports 62.

This second embodiment of a voltage divider 100 offers the advantage of being particularly light in weight compared with the first embodiment of a voltage divider 100, and of having good strength for withstanding shocks.

The invention claimed is:

1. A RC module for a RC voltage divider of an electrical substation insulated by a dielectric fluid, wherein the RC module comprises first and second plane conductive supports separated from each other in order to co-operate with the dielectric fluid to form a capacitor, the RC module equips the electrical substation, and wherein the RC module further comprises at least two resistive elements electrically connecting together the first and the second plane conductive supports, the at least two resistive elements being mounted in parallel between the first and the second plane conductive supports, each of the at least two resistive elements comprising a corresponding printed circuit defining a resistive electric circuit including a plurality of resistive 2-terminal components mounted in series.

2. The RC module according to claim 1, wherein the at least two resistive elements comprising four resistive elements mounted in parallel between the first and the second plane conductive supports.

3. The RC module according to claim 2, wherein the first and the second plane conductive supports are circularly symmetrical about an axis of revolution, the four resistive elements being distributed between the first and the second plane conductive supports with axial symmetry.

4. The RC module according to claim 1, wherein the at least two resistive elements are crisscrossed.

5. The RC module according to claim 1, wherein the at least two resistive elements are substantially perpendicular to the first and to the second plane conductive supports.

6. The RC module according to claim 1, wherein each of the least two resistive elements comprises the corresponding printed circuit defining the resistive electric circuit including the plurality of resistive 2-terminal components mounted in the series.

7. The RC module according to claim 6, wherein each corresponding printed circuit has first and second faces, the resistive electric circuit going by turn from the first face to the second face in such a manner that the resistive 2-terminal components are distributed over each of the first and the second faces of the corresponding printed circuit.

8. The RC module according to claim 7, wherein the resistive circuit on each of the first and second faces of each corresponding printed circuit is formed by conductive track portions that are mutually parallel and along which the resistive 2-terminal components are distributed, and that are connected together electrically by the conductive track portions present on the corresponding printed circuit.

9. The RC module according to claim 8, wherein each corresponding printed circuit comprises a dielectric support adapted to electrically insulate each of the conductive track portions on the first face from each of the conductive track portions on the second face.

10. The RC module according to claim 8, wherein the resistive 2-terminal components are chosen from among resistors of a surface-mount component type, resistors of a through-hole component type, and conductive track portions made of resistive material deposited on a surface of the corresponding printed circuit.

11. The RC module according to claim 1, wherein each corresponding printed circuit includes a dielectric support on which a plurality of conductive track portions are disposed that are connected together in such a manner as to form the resistive electric circuit, at least two of the conductive track portions being separated from each other by an opening provided in the dielectric support.

12. A set of RC modules according to claim 2, wherein the four resistive elements of the RC modules forms sets of resistive elements, two successive of the sets of resistive elements being electrically connected together by one of the first or the second plane conductive supports, links between each of the sets of resistive elements and the first and the second plane conductive supports to which each of the sets of resistive elements is connected being foldable in such a manner as to allow two consecutive ones of the first or the second plane conductive supports to be placed facing each other while also being mutually parallel so as to co-operate with the sets of resistive elements connecting them together to form the set of RC modules.

13. A voltage divider of a high-voltage substation insulated by a dielectric fluid, the voltage divider comprising at least two of RC modules, each of the RC modules according to claim 1, connected together in series between a ground of the high-voltage substation and a phase of the high-voltage substation.

14. The voltage divider of the high-voltage substation insulated by the dielectric fluid according to claim 13, wherein the resistive elements and the first and the second plane conductive supports being folded in such a manner that two consecutive ones of the first or the second plane conductive supports are facing each other while also being mutually parallel.

15. A RC module for a RC voltage divider of an electrical substation insulated by a dielectric fluid, wherein the RC module comprises first and second plane conductive supports separated from each other in order to co-operate with the dielectric fluid to form a capacitor, the RC module equips the electrical substation, and wherein the RC module further comprises at least one resistive element electrically connecting together the first and the second plane conductive supports, the at least one resistive element comprising a printed circuit defining a resistive electric circuit including a plurality of resistive 2-terminal components mounted in series, wherein the printed circuit includes a dielectric support on which a plurality of conductive track portions are disposed that are connected together in such a manner as to form the resistive electric circuit, at least two of the conductive track portions being separated from each other by an opening provided in the dielectric support.

16. A voltage divider designed to equip a high-voltage substation insulated by a dielectric fluid, the voltage divider comprising at least two of RC modules, each of the RC modules according to claim 15, connected together in series between a ground of the substation and a phase of the high-voltage substation.

17. A RC module for a RC voltage divider of an electrical substation insulated by a dielectric fluid, wherein the RC module comprises first and second plane conductive supports separated from each other in order to co-operate with the dielectric fluid to form a capacitor, the RC module equips the electrical substation, and wherein the RC module further comprises at least one resistive element electrically connecting together the first and the second plane conductive supports, the at least one resistive element comprising a printed circuit defining a resistive electric circuit including a plurality of resistive 2-terminal components mounted in series, the printed circuit has first and second faces, the resistive electric circuit going by turn from the first face to the second face in such a manner that the resistive 2-terminal components are distributed over each of the first and the second faces of the printed circuit, and wherein the resistive circuit on each of the first and the second faces of the printed circuit is formed by conductive track portions that are mutually parallel and along which the resistive 2-terminal components are distributed, and that are connected together electrically by the conductive track portions present on the printed circuit.

18. A voltage divider designed to equip a high-voltage substation insulated by a dielectric fluid, the voltage divider comprising at least two of RC modules, each of the RC modules according to claim 17, connected together in series between a ground of the substation and a phase of the high-voltage substation.

* * * * *